US012796167B2

(12) United States Patent
Huang et al.

(10) Patent No.: US 12,796,167 B2
(45) Date of Patent: Nov. 10, 2026

(54) MASS TRANSFER METHOD FOR LED LAMP BEADS

(71) Applicant: HKC CORPORATION LIMITED, Shenzhen (CN)

(72) Inventors: Peidi Huang, Shenzhen (CN); Wei Fu, Shenzhen (CN); Lidan Ye, Shenzhen (CN)

(73) Assignee: HKC CORPORATION LIMITED, Shenzhen (CN)

(*) Notice: Subject to any disclaimer, the term of this patent is extended or adjusted under 35 U.S.C. 154(b) by 371 days.

(21) Appl. No.: 18/650,635

(22) Filed: Apr. 30, 2024

(65) Prior Publication Data

US 2024/0405154 A1 Dec. 5, 2024

(30) Foreign Application Priority Data

May 29, 2023 (CN) ......................... 202310614589.3

(51) Int. Cl.
*H01L 33/00* (2010.01)
*H10H 20/01* (2025.01)

(52) U.S. Cl.
CPC ................................ *H10H 20/018* (2025.01)

(58) Field of Classification Search
CPC .... H10H 20/01; H10H 20/018; H10H 20/019; H10H 20/80; H10D 86/0214; H10F 55/255
See application file for complete search history.

(56) References Cited

U.S. PATENT DOCUMENTS 11,615,972 B2 * 3/2023 Colosimo ........... H10P 72/0436 414/787
2018/0053751 A1 * 2/2018 Zou ...................... H10H 20/018
2019/0027642 A1 * 1/2019 Zou ........................ H10H 20/01
2019/0319163 A1 10/2019 Schuele et al.
2020/0321390 A1 10/2020 Wu et al.
2022/0216370 A1 7/2022 Hung-Wen

FOREIGN PATENT DOCUMENTS

CN 109791959 A 5/2019
CN 109920885 A 6/2019
CN 110034218 A 7/2019
CN 110349902 A 10/2019
CN 111048497 A 4/2020

(Continued)

*Primary Examiner* — David C Spalla
(74) *Attorney, Agent, or Firm* — Maier & Maier, PLLC

(57) ABSTRACT

A mass transfer method for LED lamp beads, including: providing a growth substrate, the growth substrate includes a first substrate and an LED lamp bead array disposed on one surface of the first substrate, LED lamp beads of the LED lamp bead array are connected to the first substrate through a release layer; providing a driver circuit substrate, the driver circuit substrate includes a second substrate and a lamp mount array disposed on one surface of the second substrate, the lamp mount array is matched with the LED lamp bead array; moving the growth substrate to a position above the driver circuit substrate, and rotating the growth substrate and/or the driver circuit substrate so that the LED lamp bead array is aligned with the lamp mount array; and evaporating the release layer and removing the first substrate.

18 Claims, 9 Drawing Sheets

(56) References Cited

FOREIGN PATENT DOCUMENTS

| | | | |
|---|---|---|---|
| CN | 111883553 | A | 11/2020 |
| CN | 112908897 | A | 6/2021 |
| CN | 113571608 | A | 10/2021 |
| CN | 114975728 | A | 8/2022 |
| CN | 115083990 | A | 9/2022 |
| KR | 20200087110 | A | 7/2020 |
| WO | 2020233242 | A1 | 11/2020 |

* cited by examiner

MASS TRANSFER METHOD FOR LED LAMP BEADS

CROSS-REFERENCE TO RELATED APPLICATIONS

The present application claims the benefit of Chinese patent application No. 202310614589.3 filed on May 29, 2023, titled "Mass transfer method for LED lamp beads", the entire contents of which are incorporated herein by reference.

TECHNICAL FIELD

The present application relates to semiconductor displays, and in particular, to a mass transfer method for LED lamp beads.

BACKGROUND

During the manufacturing of LED lamp beads, such as mini-LED/micro-LED, a series of processes are carried out to make LED lamp beads one by one on a growth substrate, and then LED lamp beads are transferred to a driver circuit substrate. Because the size of LED lamp beads is extremely small, the number of LED lamp beads that need to be transferred is extremely large. The technique of transferring a large number of micro-components from one substrate to another is known as mass transfer.

Due to the characteristics of mini-LED/micro-LED, the size of the LED lamp bead is very small. There remains a challenge of transferring and installing a large number of micron-sized LED lamp bead chip particles to the driver circuit substrate when using the mini-LED/micro-LED for display. This requires technical support with higher precision and higher transfer volume.

There are two difficulties in the mass transfer of LED lamp beads: first, the manufactured LED lamp beads are transferred from the growth substrate and to the driver board, and the transfer thickness of the manufactured LED lamp beads only accounts for about 3% of the overall thickness of the LED lamp beads and the growth substrate, so the fine operation technology required is difficult to operate; second, the quantities need to be transferred at one time is very large, for example, for a full high-definition display product (with a resolution of 1920*1080), there are 1920*1080*3=6,220,800 LED lamp beads to be transferred, so the efficiency of transferring millions of LED lamp beads is low.

SUMMARY

The present application is to provide a mass transfer method for LED lamp beads, aiming to at least solve the technical problems of high difficulty and low efficiency in the existing mass transfer of LED lamp beads.

The present application provides a mass transfer method for LED lamp beads, the method includes:

- S100: providing a growth substrate, the growth substrate includes a first substrate and an LED lamp bead array disposed on one surface of the first substrate, LED lamp beads of the LED lamp bead array are connected to the first substrate through a release layer;
- S200: providing a driver circuit substrate, the driver circuit substrate includes a second substrate and a lamp mount array disposed on one surface of the second substrate, the lamp mount array is matched with the LED lamp bead array;
- S300: moving the growth substrate to a position above the driver circuit substrate, and rotating the growth substrate and/or the driver circuit substrate so that the LED lamp bead array is aligned with the lamp mount array; and
- S400: evaporating the release layer and removing the first substrate.

In one of the embodiments, a first workbench includes a first operating platform and a first support column rotatably connected to the first operating platform, and the growth substrate is detachably fixed on one side of the first operating platform away from the first support column;

Step S300 specifically includes the following steps:

- S310: grasping the first workbench with a robot arm, and moving the first workbench to the position above the driver circuit substrate;
- S320: rotating the first operating platform, so that the LED lamp bead array is aligned with the lamp mount array; and
- S330: separating the growth substrate from the first operating platform.

In one of the embodiments, a circular track groove is provided on one of the first operating platform and the first support column, and a sliding wheel is provided on the other one of the first operating platform and the first support column, the sliding wheel is slidably disposed in the circular track groove.

In one of the embodiments, the first workbench further includes a first air pipe and a first airbag, the first air pipe is fixedly installed on the first operating platform with an end of the first air pipe extending to protrude from the growth substrate, the first airbag is mounted at the end of the first air pipe and communicates with the first air pipe, the first airbag is pressed against the first substrate when inflated, so as to press and fix the growth substrate on the first operating platform.

In one of the embodiments, step S320 includes:

- S321: placing the driver circuit substrate on a second operating platform of a second workbench, a first optical alignment mark is provided on the first operating platform, and a second optical alignment mark is provided on the second operating platform; and
- S322: rotating the first operating platform to align the first optical alignment mark with the second optical alignment mark.

In one of the embodiments, each LED lamp bead has a first electrode facing away from the first substrate, a lamp mount in the lamp mount array is a lamp recess, and a second electrode is provided on a bottom of the recess.

In one of the embodiments, the first electrode includes a first anode and a first cathode, and the second electrode includes a second anode and a second cathode.

The first cathode is a first annular electrode, the first anode is a first solid block electrode, the first annular electrode is disposed around the first solid block electrode with a gap between the first annular electrode and the first solid block electrode. The second cathode is a second annular electrode, the second anode is a second solid block electrode, and the second annular electrode is disposed around the second solid block electrode with a gap between the second annular electrode and the second solid block electrode.

In one embodiment, a gap between the second annular electrode and a wall of the lamp recess is smaller than the gap between the first annular electrode and the first solid block electrode.

In one of the embodiments, after step S100, the method further includes: washing the growth substrate with a cleaning solution, so that a water film is formed on a surface of the LED lamp bead array;

and/or, after step S200, the method further includes: washing the driver circuit substrate with a cleaning solution, so that a water film is formed on a surface of the lamp mount array.

In one of the embodiments, step S400 is specifically:

abutting a boss of a roller against a back side of the growth substrate; and heating the boss to evaporate the release layer.

The advantageous effect of the mass transfer method for LED lamp beads provided by the present application is: the LED lamp bead array including a plurality of LED lamp beads is transferred at one time through the growth substrate, in which the growth substrate is moved above the driver circuit substrate, and the growth substrate and/or driver circuit substrate is rotated, so that the LED lamp bead array is aligned with the lamp mount array, and then the release layer is evaporated so that the LED lamp bead array is separated from the first substrate, and the first substrate is removed. By aligning the LED lamp bead array with the lamp mount array, there is no need to transfer individual LED lamp beads with an extremely small thickness, which solves the technical problems of high difficulty and low efficiency in the existing mass transfer of LED lamp beads, thereby increasing the transfer amount of LED lamp beads, improving the alignment accuracy, and reducing the cost at the same time.

BRIEF DESCRIPTION OF THE DRAWINGS

In order to more clearly illustrate the technical proposals in embodiments of the present application, accompanying drawings that are used in the description of the embodiments or exemplary existing technologies are briefly introduced hereinbelow. Apparently, the drawings in the following description are merely some embodiments of the present application. For those skilled in the art, other drawings can also be obtained according to these drawings without any creative effort.

Figure 1:
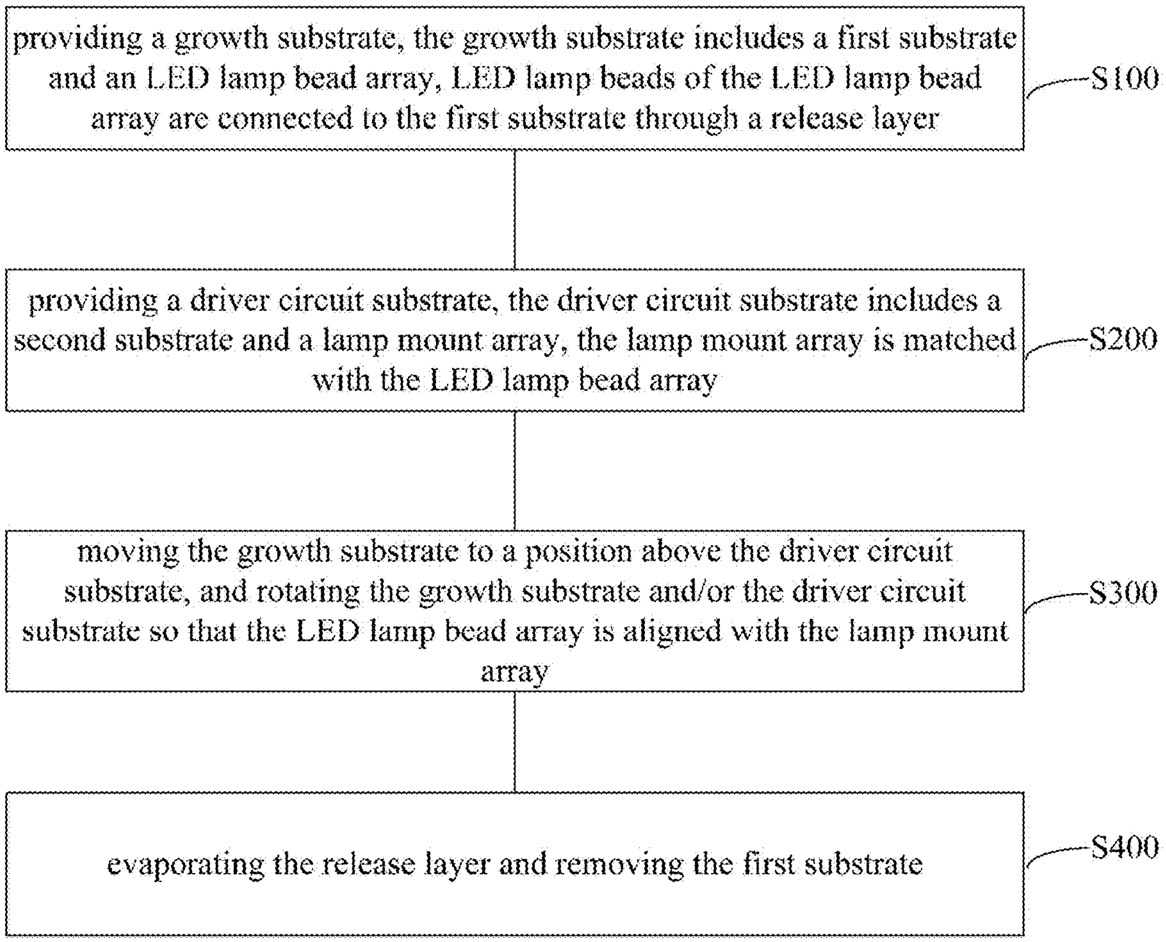
FIG. 1 is a flow chart of a mass transfer method for LED lamp beads provided by an embodiment of the present application.

The reference signs in the drawings are as follows:

10 growth substrate; 11 first substrate; 12 LED lamp bead array; 121 LED lamp bead; 1211 first electrode; 1212 first anode; 1213 first cathode; 1214 first chamfer; 13 third optical alignment mark; 14 release layer;

20 driver circuit substrate; 21 second substrate; 22 lamp mount array; 221 lamp mount; 222 lamp recess; 2221 second electrode; 2222 second anode; 2223 second cathode; 2224 second chamfer; 23 fourth optical alignment mark;

30 first workbench; 31 first operating platform; 32 first support column; 33 circular track groove; 34 first rotating shaft; 35 first air pipe; 36 first airbag; 37 first suction cup; 38 first optical alignment mark; 39 sliding wheel;

40 second workbench; 41 second operating platform; 42 second support column; 43 circular limiting groove; 44 second rotating shaft; 45 second air pipe; 46 second airbag; 47 second suction cup; 48 the second optical alignment mark;

50 roller; and 51 boss.

DETAILED DESCRIPTION OF THE EMBODIMENTS

Embodiments of the present application are described in detail below, examples of which are shown in the drawings. The same or similar reference numerals designate the same or similar elements or elements having the same or similar functions throughout. The embodiments described below with reference to the drawings are exemplary and are intended to explain the present application and should not be construed as limiting the present application.

Reference throughout this specification to "one embodiment" or "an embodiment" means that a particular feature, structure or characteristic described in combination with the embodiment is included in at least one embodiment of the present application. Thus, the terms "in one embodiment" or "in some embodiments" appear in various places throughout the specification, not all referring to the same embodiments. Furthermore, the particular features, structures or characteristics may be combined in any suitable manner in one or more embodiments.

In the description of the present application, it should be understood that orientations or positional relationships indicated by terms "length", "width", "upper", "lower", "front", "back", "left", "right", "vertical", "horizontal", "top", "bottom", "inner", "outer", etc. are based on the orientations or positional relationships shown in the drawings, and are only for the convenience of describing the present application and simplifying the description, and are not for any indication or implication that the referred device or element must have a specific orientation, be constructed and operate in a specific orientation should not be construed as a limitation on the application.

In addition, the terms "first" and "second" are used for descriptive purposes only and cannot be understood as indicating or implying relative importance or implicitly indicating the quantity of indicated technical features. Therefore, features defined as "first" and "second" may explicitly or implicitly include one or more of these features.

In the present application, unless otherwise clearly specified and defined, terms such as "installation", "connected", "connection" and "fix" should be understood in a broad sense, for example, it can be a fixed connection or a detachable connection, or integrated; it can be mechanically connected or electrically connected; it can be directly connected or indirectly connected through an intermediary, and it can be the internal communication of two components or the interaction relationship between two components. Those of ordinary skill in the art can understand the specific meanings of the above terms in the present application according to specific situations.

The size of LED lamp beads, such as mini-LED and micro-LED, is small thus it is difficult to achieve mass transfer. Micro-LED (micro light-emitting diode) is a new generation of display technology. Compared with OLED (organic light-emitting display) technology, micro-LED has higher brightness and better luminous efficiency but lower power consumption, so the market prospect of micro-LED is very promising. The structure of micro-LED includes such as epi-up, flip-chip, and vertical structures. However, the size of each micro-LED is only 10 μm to 50 μm, which is exceptionally small, and the mass transfer thereof is more difficult.

There are two difficulties in the mass transfer of LED lamp beads: first, the manufactured LED lamp beads are transferred from the growth substrate and to the driver board, and the transfer thickness of the manufactured LED lamp beads only accounts for about 3% of the overall thickness of the LED lamp beads and the growth substrate, so the fine operation technology required is difficult to operate; second, the quantities need to be transferred at one time is very large, for example, for a full high-definition display product (with a resolution of 1920*1080), there are 1920*1080*3=6,220,800 LED lamp beads to be transferred, so it is necessary to consider that the transfer technology of millions of LED lamp beads must meet the existing efficiency requirements.

A related mass transfer method adopts the use of a combined transfer printing technology of mechanical press and laser welding. The LED lamp beads on the growth substrate are transferred to the driver circuit substrate by a transfer unit, and the LED lamp beads on the substrate are pressed down and fitted to the driver circuit substrate by a mechanical press so as to be welded to the driver substrate by a welding unit, and a monitoring unit monitors the effect, temperature, welding status, and the like. The current technical capability of mechanical transfer can transfer 50-100 LED lamp beads per second, the size of the lamp beads that can be transferred is 200 μm-50 μm, and the transfer accuracy reaches 2 μm-5 μm. Therefore, the mass transfer method in the related art has the following problems: first, the number of LED lamp beads transferred per second is small. Taking an efficiency of 100 LEDs per second as an example, for an FHD product, (1920*1080*3)/100/60/60≈17 hours. That is, it takes 17 hours to produce an FHD product, and it takes about 6 hours even with equipment with three presses, and the daily output is too low; second, the press unit needs to operate the LED lamp beads one by one, which causes wearing of the press and equipment damage; third, the structural design of the press is relatively sharp, which may cause damage to the LED bead.

Figure 2:
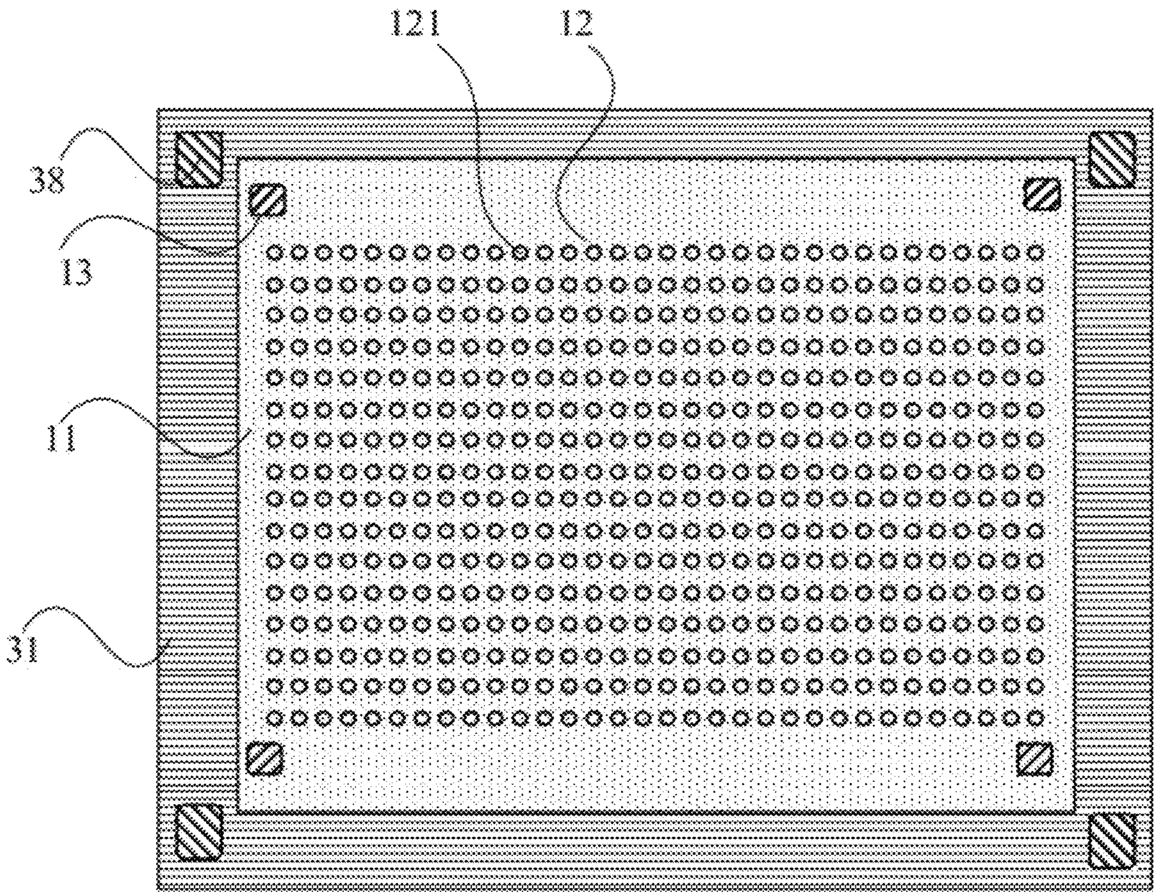
FIG. 2 is a schematic structural diagram of the growth substrate placed on the first operating platform according to an embodiment.
Figure 5:
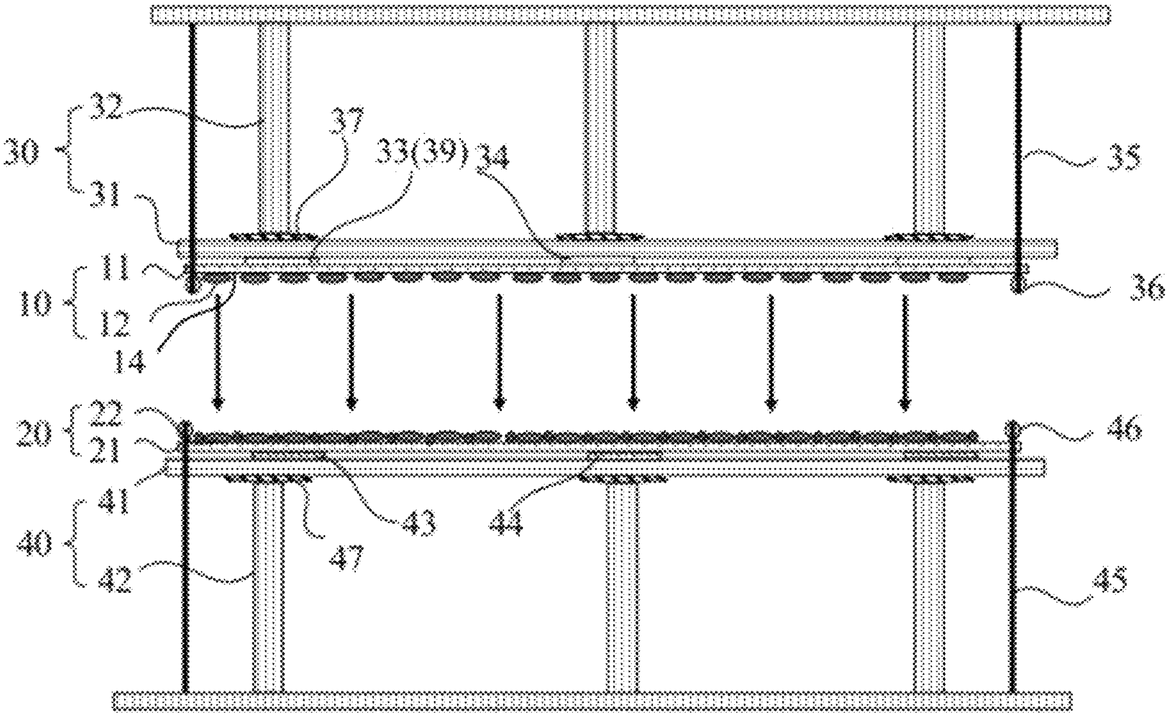
FIG. 5 is a schematic diagram of the alignment of the growth substrate with the driver circuit substrate according to an embodiment.

The mass transfer method of LED lamp beads 121 in an embodiment of the present application will be described in conjunction with FIG. 1, the method includes:

S100: referring to FIG. 2 and FIG. 5, providing a growth substrate 10. The growth substrate 10 includes a first substrate 11 and an LED lamp bead array 12 disposed on one surface of the first substrate 11, and LED lamp beads 121 of the LED lamp bead array 12 are connected to the first substrate 11 through a release layer 14.

Specifically, the first substrate 11 is a sapphire substrate, a gallium nitride substrate, an aluminum nitride substrate, a silicon substrate, a gallium arsenide substrate, and a silicon carbide substrate, the present application does not limit the specific type of the first substrate 11. Optionally, the first substrate 11 is a wafer substrate, and the wafer substrate refers to a silicon wafer used for manufacturing silicon semiconductor circuits, and the raw material thereof is silicon. High-purity polycrystalline silicon is dissolved, and silicon crystal seeds are added and then slowly pulled out to form a cylindrical single-crystal silicon. The silicon ingot is ground, polished, and sliced to form a silicon wafer, that is, a wafer substrate.

Optionally, step S100 includes manufacturing the LED lamp bead array 12 on the first substrate 11. Specifically, a conventional LED chip is miniaturized, arrayed, and thinned utilizing the miniaturization process technology. For example, it undergoes processes like substrate, epitaxy process, epi-wafer, cleaning, evaporation, yellow light process, chemical etching, fusion, grinding, cutting, testing, and the like, the LED lamp beads 121 can be made into different shapes in the chemical etching stage. That is, the shape of the LED lamp beads 121, including the shape of the first electrode 1211, can be designed in the chemical etching stage.

Figure 3:
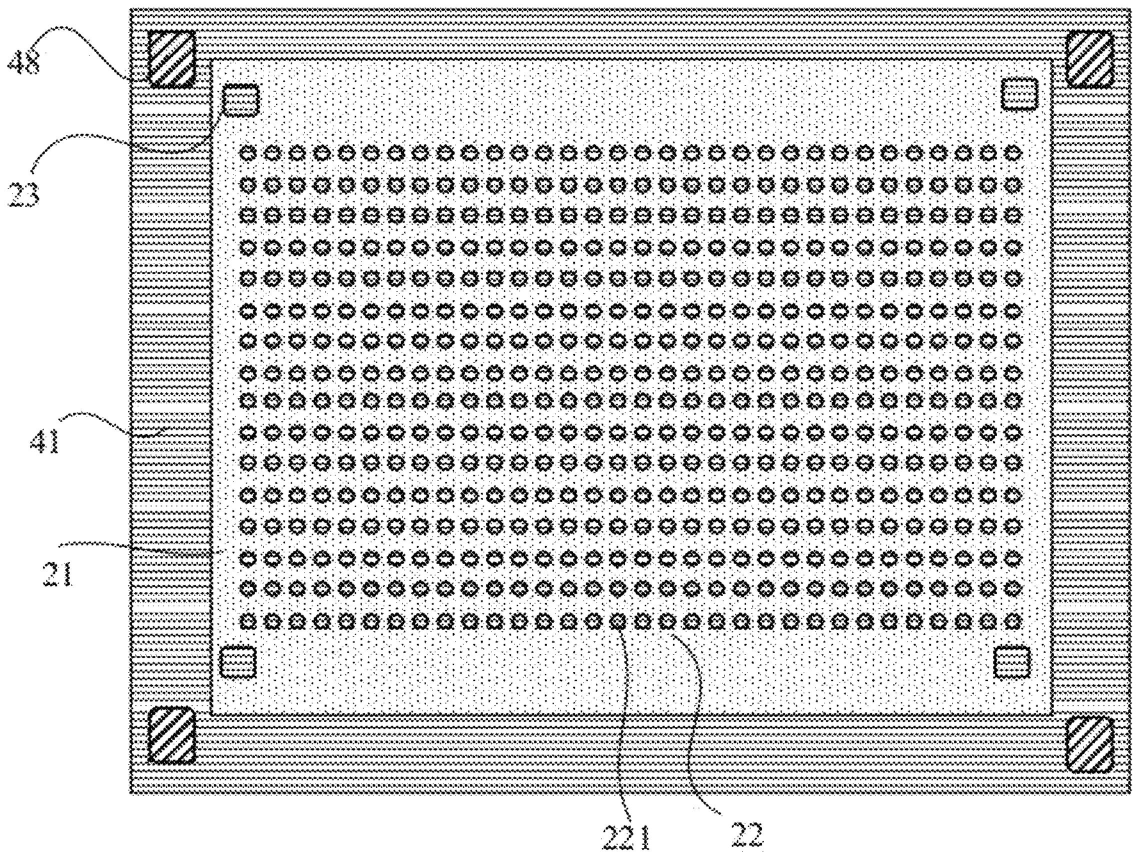
FIG. 3 is a schematic structural diagram of the driver circuit substrate placed on the second operating platform according to an embodiment.

S200: referring to FIG. 3, providing a driver circuit substrate 20. The driver circuit substrate 20 includes a second substrate 21 and a lamp mount array 22 disposed on one surface of the second substrate 21, the lamp mount array 22 is matched with the LED lamp bead array 12.

Specifically, the second substrate 21 is a sapphire substrate, a gallium nitride substrate, an aluminum nitride substrate, a silicon substrate, a gallium arsenide substrate, and a silicon carbide substrate, the present application does not limit the specific type of the second substrate 21.

The lamp mount array 22 is matched with the LED lamp bead array 12, including the situation that the LED lamp bead array 12 is designed and manufactured in accordance with the size, pitch, and arrangement of the lamp mount array 22, the situation that the lamp mount array 22 is designed and manufactured in accordance with the size, pitch, and arrangement of the LED lamp bead array 12, and the situation that the lamp mount array 22 and the LED lamp bead array 12 are designed and manufactured in accordance with a preset array, so as to match each other.

The present method may be performed by performing step S100 before step S200, or may be performed by performing step S200 before step S100, or may also be performed by simultaneously performing step S100 and step S200.

Figure 4:
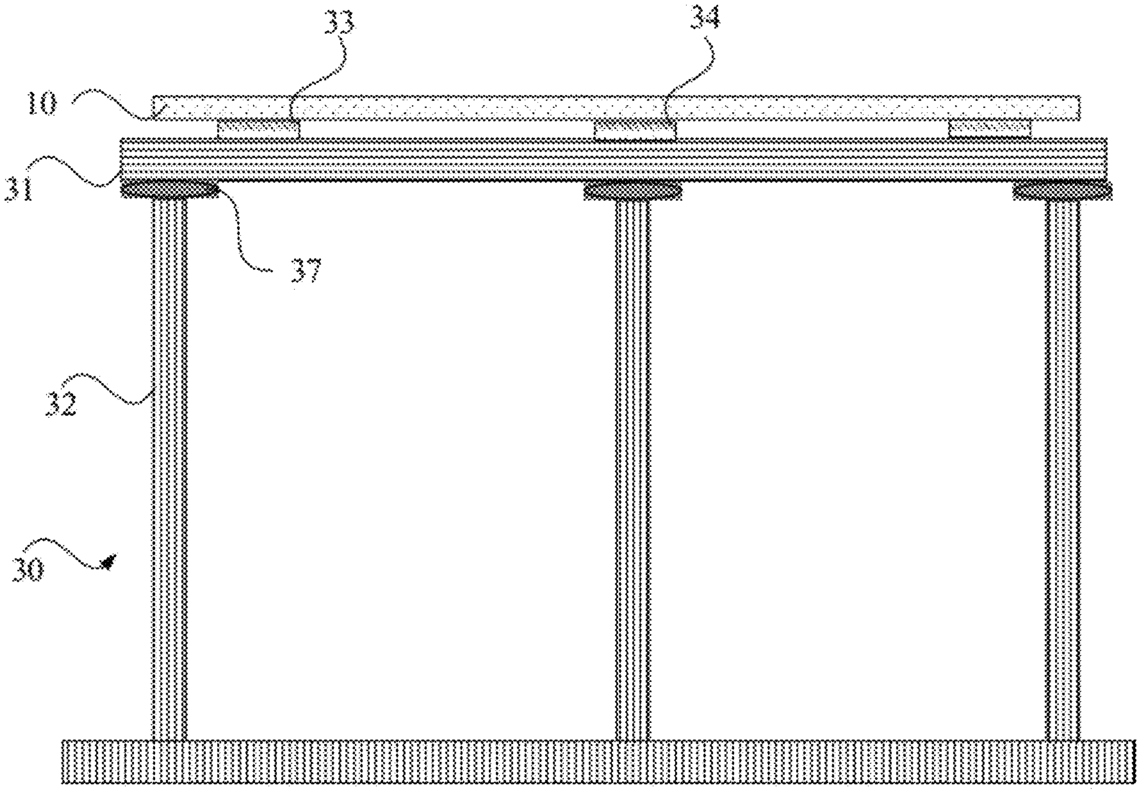
FIG. 4 is a schematic structural diagram of the growth substrate placed on the first workbench according to an embodiment.

S300: referring to FIG. 4 and FIG. 5, moving the growth substrate 10 to a position above the driver circuit substrate 20, and the growth substrate 10 and/or the driver circuit substrate 20 is rotated to align the LED lamp bead array 12 with the lamp mount array 22. Specifically, the alignment of the LED lamp bead array 12 and the lamp mount array 22 can be achieved by rotating the growth substrate 10, or rotating the driver circuit substrate 20, or rotating the growth substrate 10 and the driver circuit substrate 20 respectively.

Figure 6:
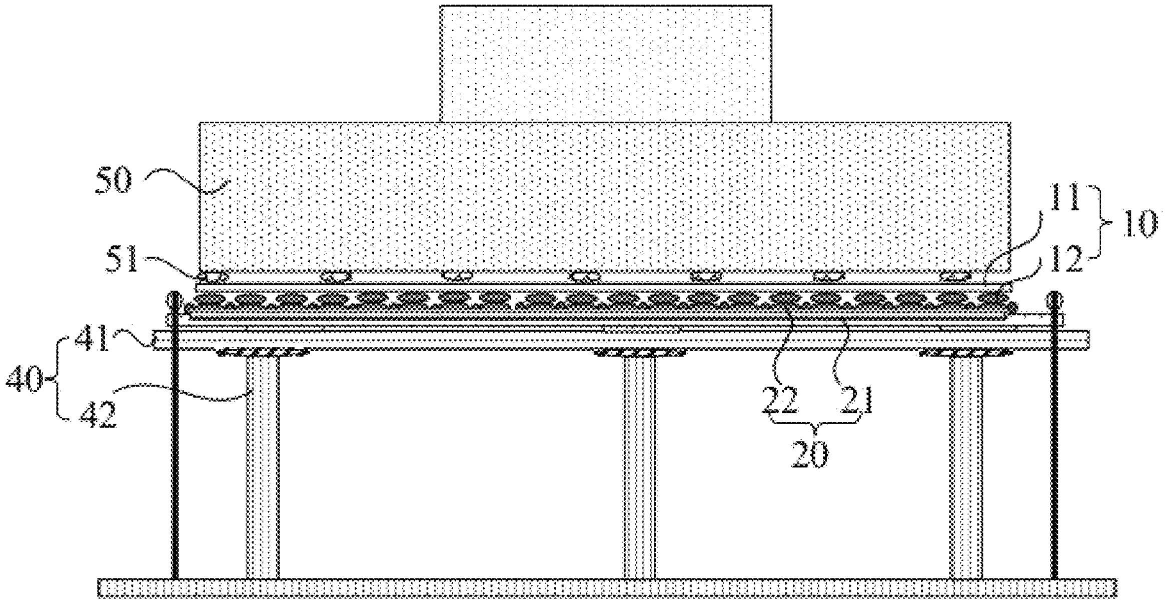
FIG. 6 is a schematic structural diagram of the evaporation of the release layer according to an embodiment.

S400: referring to FIG. 6, evaporating the release layer 14 and removing the first substrate 11.

Optionally, after step S400, the method further includes: manufacturing a protective layer by physical deposition, and encapsulating the LED lamp bead array 12 on the driver circuit substrate 20.

In the present application, the LED lamp bead array 12 including a plurality of LED lamp beads 121 is transferred at one time through the growth substrate 10, and the growth substrate 10 is moved to a position above the driver circuit substrate 20. The LED lamp bead array 12 is aligned with the lamp mount array 22 by rotating the growth substrate 10 and/or the driver circuit substrate 20, and then the release layer 14 is evaporated to separate the LED lamp bead array 12 from the first substrate 11 so that the first substrate 11 is removed, and the LED lamp bead array 12 remains its alignment with the lamp mount array 22, thus there is no need to transfer individual LED lamp beads 121 which have a very small thickness and the technical problem of high difficulty and low efficiency in the existing mass transfer of the LED lamp beads 121 can be solved, thereby improving the transfer amount, the transfer efficiency and the alignment accuracy of the LED lamp beads 121 and reducing the cost at the same time.

When the LED lamp bead 121 is a micro-LED lamp bead 121, the micro-LED lamp bead 121 includes a red lamp bead, a blue lamp bead and a green lamp bead. In this case, in step 100, a first substrate, a second substrate and a third substrate are provided, the first substrate includes a red-light substrate and a red-light lamp bead array arranged on one surface of the red-light substrate, and the second substrate includes a blue-light substrate and a blue-light lamp bead array arranged on one surface of the blue-light substrate, the third substrate includes a green-light substrate and a green-light lamp bead array arranged on one surface of the green-light substrate. The red-light lamp bead array of the first substrate, the blue-light lamp bead array of the second substrate and the green-light lamp bead array of the third substrate are combined into the LED lamp bead array 12, which matches the lamp mount array 22 of the driver circuit substrate 20.

Step S300 and step S400 are respectively performed on the first substrate, the second substrate and the third substrate, without any specific limitations on the order of the substrates.

In a possible embodiment, step S300 and step S400 are first performed on the second substrate, that is, the second substrate is moved to a position above the driver circuit substrate 20, the second substrate and/or the driver circuit substrate 20 is rotated so that the blue-light lamp bead array is aligned with the lamp mount array 22; the release layer of the second substrate is evaporated to remove the blue-light substrate. Next, step S300 and step S400 are repeated on the first substrate, that is, the first substrate is moved to a position above the driver circuit substrate 20, and the first substrate and/or the driver circuit substrate 20 is rotated so that the red-light lamp bead array is aligned with the lamp mount array 22; the release layer of the first substrate is evaporated to remove the red-light substrate. Finally, step S300 and step S400 are repeated on the third substrate, that is, the third substrate is moved to a position above the driver circuit substrate 20, and the third substrate and/or the driver circuit substrate 20 is rotated so that the green-light lamp bead array is aligned with the lamp mount array 22; the release layer of the third substrate is evaporated to remove the green-light substrate.

In some embodiments, referring to FIG. 4, the first workbench 30 includes a first operating platform 31 and first support columns 32 rotatably connected to the first operating platform 31, and the growth substrate 10 is detachably fixed on one side of the first workbench 30 away from the first support columns 32.

Step S300 specifically includes the following steps S310-S330:

S310: grasping the first workbench 30 by a robot arm, and moving the first workbench 30 to a position above the driver circuit substrate 20.

S320: rotating the first operating platform 31, that is, rotating the growth substrate 10, so that the LED lamp bead array 12 is aligned with the lamp mount array 22.

S330: separating the growth substrate 10 from the first operating platform 31.

In the present application, the growth substrate 10 can be conveniently moved and rotated by means of the first workbench 30 and the robot arm, so as to realize the alignment of the LED lamp bead array 12 and the lamp mount array 22.

Optionally, when the LED lamp bead 121 is a micro-LED lamp bead 121, the number of the first workbench 30 is three, the number of the robot arm is also three, and the three first workbenches 30 and the three robot arms respectively correspond to the first substrate, the second substrate and the third substrate, so that step S300 and step S400 are respectively performed on the first substrate, the second substrate and the third substrate in no particular order.

In one of the embodiments, referring to FIG. 4 and FIG. 5, one of the first operating platform 31 and the first support columns 32 is provided with a circular track groove 33, and the other one of the first operating platform 31 and the first support columns 32 is provided with a sliding wheel 39, the sliding wheel 39 is slidably disposed in the circular track groove 33, and the sliding wheel 39 slides along a circumferential direction of the circular track groove 33, thereby driving the first operating platform 31 or the first support columns 32 connected thereto to rotate, realizing a relative rotation between the first operating platform 31 and the first support columns 32, namely the rotation of the growth substrate 10 mounted on the first operating platform 31.

In a possible example, referring to FIG. 4, the number of the circular track groove 33 is one, and correspondingly, the number of the slider is one. In another possible example, the number of the circular track groove 33 may be more than two, and the more than two circular track grooves are arranged concentrically. Correspondingly, the number of the slider is more than two.

In one possible example, referring to FIG. 4, the first support columns 32 are connected with a first rotating shaft 34, the first rotating shaft 34 is rotatably connected to the first operating platform 31, and is perpendicular to the circular track groove 33, passing through the center of the circular track groove 33, so that the first rotating shaft 34 can support the relative rotation between the first operating platform 31 and the first support columns 32.

Optionally, the first operating platform 31 is provided with a circular track groove 33, and the first support columns 32 are each provided with a sliding wheel 39.

In one of the embodiments, referring to FIG. 5, the first workbench 30 further includes a first air pipe 35 and a first airbag 36, the first air pipe 35 is fixedly installed on the first operating platform 31, and an end of the first air pipe 35 extends to protrude from the growth substrate 10, and the first airbag 36 is mounted at the end of the first air pipe 35 and communicated with the first air pipe 35. The first airbag 36 is pressed against the first substrate 11 when being inflated to press and fix the growth substrate 10 on the first operating platform 31. When the first air pipe 35 is filled with gas, the first airbag 36 expands, and the first substrate 11 is clamped between the first airbag 36 and the first operating platform 31, so that the growth substrate 10 is fixed on the first operating platform 31. When air is pumped into or released from the first air pipe 35, the first airbag 36 contracts, so that the first substrate 11 is released, and the growth substrate 10 can be separated from the first operating platform 31. The inflation and deflation of the first airbag 36 allow the growth substrate 10 to be detachably fixed on the first operating platform 31 without damaging the growth substrate 10, and the operation of the substrate is easy to control, which improves the efficiency.

It can be understood that, in other embodiments, the growth substrate 10 may also be detachably fixed on the first operating platform 31 through a stretchable pressing block, or the growth substrate 10 may be detachably bonded to the first operating platform 31, which is not particularly limited here.

In one embodiment, the first support columns 32 are detachably connected to the first operating platform 31 through first suction cups 37, which is convenient for fixing and separating the first support columns 32 and the first operating platform 31, without the need for operations like removing screws and the like, which is conducive to improving efficiency.

In one embodiment, the growth substrate 10 may be processed and manufactured on the first workbench 30. Specifically, the first substrate 11 is detachably fixed on the first operating platform 31, and then the LED lamp bead array 12 is formed on the first substrate 11 through a manufacturing process.

In one of the embodiments, referring to FIG. 2 and FIG. 3, step S320 includes steps S321-S322:

- S321: placing the driver circuit substrate 20 on the second operating platform 41 of the second workbench 40, the first operating platform 31 is provided with a first optical alignment mark 38, and the second operating platform 41 is provided with a second optical alignment mark 48. The numbers of the first optical alignment mark 38 and the second optical alignment mark 48 are equal.

Optionally, the number of the first optical alignment mark 38 may be one or more. For example, referring to FIG. 2, when there are a plurality of first optical alignment marks 38, the plurality of first optical alignment marks 38 are arranged along a circumferential direction of the first operating platform 31 at intervals. In the embodiment shown in FIG. 2, the shape of the first operating platform 31 is square, and four first optical alignment marks 38 are arranged at four corners of the first operating platform 31.

Optionally, the number of the second optical alignment mark 48 may be one or more. For example, referring to FIG. 3, when there are a plurality of second optical alignment marks 48, the plurality of second optical alignment marks 48 are arranged along a circumferential direction of the second operating platform 41 at intervals. In the embodiment shown in FIG. 3, the shape of the second operating platform 41 is square, and four second optical alignment marks 48 are arranged at four corners of the second operating platform 41.

- S322: rotating the first operating platform 31 to align the first optical alignment mark 38 with the second optical alignment mark 48. By means of the first optical alignment mark 38 and the second optical alignment mark 48, the alignment of the growth substrate 10 and the driver circuit substrate 20 can be conveniently determined and calibrated.

Specifically, referring to FIG. 2, the growth substrate 10 is provided with third optical alignment marks 13, which are used for precise positioning and mounting of the growth substrate 10 on the first operating platform 31.

Specifically, referring to FIG. 3, the driver circuit substrate 20 is provided with fourth optical alignment marks 23, which are used for precise positioning and mounting of the driver circuit substrate 20 on the second operating platform 41.

In some embodiments, referring to FIG. 5, one of the second operating platform 41 and the first support columns 32 is provided with a circular limiting groove 43, and the other one of the second operating platform 41 and the second support columns 42 is provided with a limiting wheel, the limiting wheel is slidably arranged in the circular limiting groove 43, and the limiting wheel slides along a circumferential direction of the circular limiting groove 43, thereby driving the second operating platform 41 or the second support columns 42 connected thereto to rotate, realize the relative rotation between the second operating platform 41 and the second support columns 42, namely, the rotatable configuration of the driver circuit substrate 20 mount on the second operating platform 41.

In a possible example, the number of circular limiting groove 43 is one or more than two, and the more than two circular limiting grooves are arranged concentrically.

In one possible example, referring to FIG. 5, the second support columns 42 are connected with a second rotating shaft 44, the second rotating shaft 44 is rotatably connected to the second operating platform 41, and is perpendicular to the circular limiting groove 43 and passes through the center of the circular limiting groove 43, so that the second rotating shaft 44 can support the relative rotation between the second operating platform 41 and the second support columns 42.

In one of the embodiments, referring to FIG. 5, the second workbench 40 further includes a second air pipe 45 and a second airbag 46, the second air pipe 45 is fixedly installed on the second operating platform 41, and an end of the second air pipe 45 extends to protrude from the driver circuit substrate 20, the second airbag 46 is mounted at the end of the second air pipe 45 and communicated with the second air pipe 45. The second airbag 46 is pressed against the second substrate 21 when being inflated to press and fix the driver circuit substrate 20 on the second operating platform 41. The inflation and deflation of the second airbag 46 allow the driver circuit substrate 20 to be detachably fixed on the second operating platform 41 without damaging the driver circuit substrate 20, so that the operation of the substrate is easy to control, which is conducive to improving efficiency.

It can be understood that, in other embodiments, the driver circuit substrate 20 may also be detachably fixed on the second operating platform 41 through a retractable pressing block, or the driver circuit substrate 20 may be detachably bonded to the second operating platform 41, which is not particularly limited here.

In one embodiment, the second support columns 42 are detachably connected to the second operating platform 41 through the second suction cups 47, facilitating fixing and separation between the second support columns 42 and the second operating platform 41, without the need for operations such as removing screws and the like, which is conducive to improving efficiency.

Figure 7:
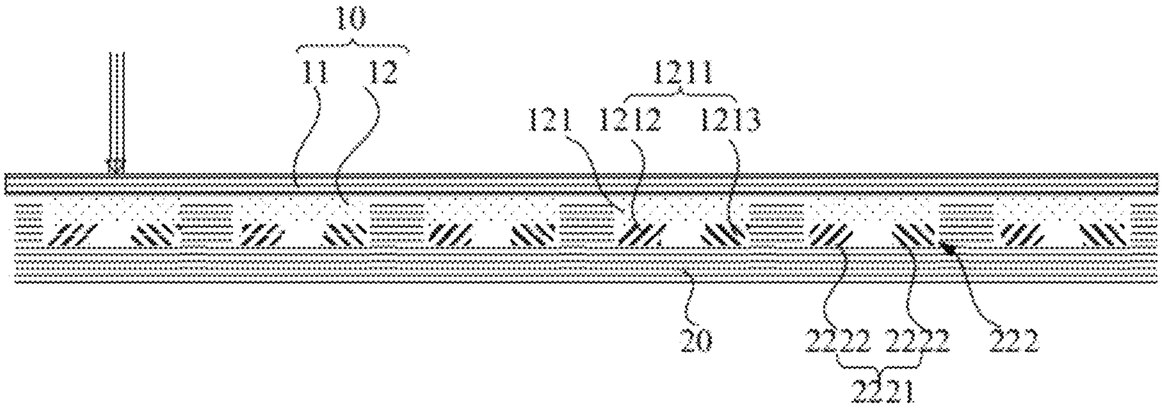
FIG. 7 is a schematic diagram of the alignment of the LED lamp beads with the lamp mounts according to an embodiment.

In some embodiments, referring to FIG. 7, each LED lamp bead 121 has a first electrode 1211 disposed away from the first substrate 11. The lamp mount 221 of the lamp mount array 22 is a lamp recess 222, and a second electrode 2221 is provided at the bottom of the lamp recess 222. The arrangement of the lamp recess 222 is beneficial to the precise positioning of the LED lamp bead 121. When the LED lamp bead array 12 is aligned with the lamp mount array 22, the first electrode 1211 and the second electrode 2221 are in contact with each other.

Figure 8:
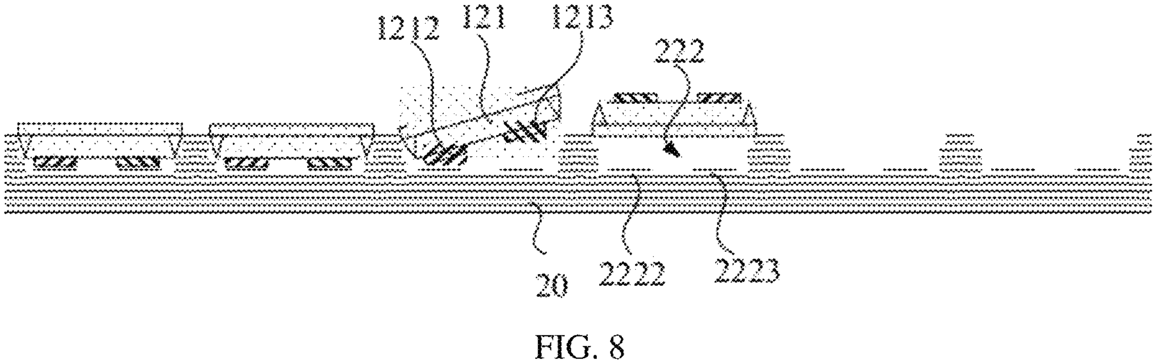
FIG. 8 is another schematic diagram of the alignment of the LED lamp beads with the lamp mounts according to an embodiment.
Figure 9:
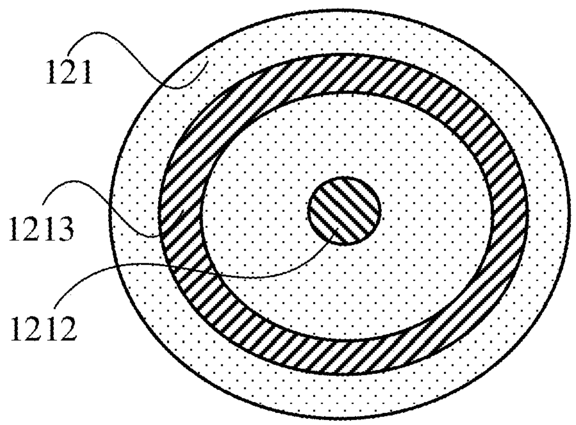
FIG. 9 is a schematic structural diagram of the LED lamp bead according to an embodiment.

In one embodiment, referring to FIG. 7 to FIG. 9, the first electrode 1211 includes a first anode 1212 and a first cathode 1213, and the second electrode 2221 includes a second anode 2222 and a second cathode 2223. The first anode 1212 is configured for aligning and electrical connection with the second anode 2222, and the first cathode 1213 is configured for aligning and electrical connection with the second cathode 2223.

The shapes and dimensions of the first anode 1212, the first cathode 1213, the second anode 2222 and the second cathode 2223 are independently designed, and can be ring-shaped, dot-shaped, polygonal, circular, elliptical, or irregular.

In one embodiment, referring to FIG. 7 and FIG. 8, the first anode 1212, the first cathode 1213, the second anode 2222 and the second cathode 2223 are all in a square shape. In a case of inaccurate alignment, the first anode 1212 and the second anode 2222 may not be in contact to connect with each other, the first cathode 1213 and the second cathode 2223 may not be in contact to connect with each other, or even the first anode 1212 may be in contact with the second cathode 2223, resulting in a short circuit.

Figure 10:
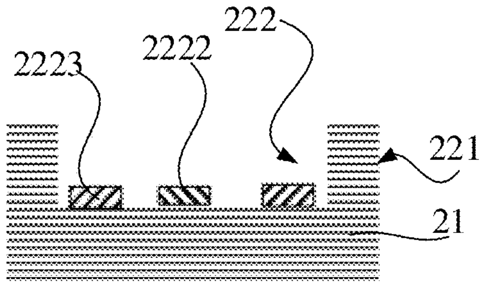
FIG. 10 is a schematic structural diagram of the lamp mount according to an embodiment.

In another embodiment, referring to FIG. 9 and FIG. 10, the first cathode 1213 is a first annular electrode, the first anode 1212 is a first solid block electrode, and the first annular electrode is arranged around the first solid block electrode with a gap between the first annular electrode and the first solid block electrode, the second cathode 2223 is a second annular electrode, the second anode 2222 is the second solid block electrode, and the second annular electrode is arranged around the second solid block electrode, with a gap between the second annular electrode and the second solid block electrode. With such configuration, when the LED lamp bead 121 enters the lamp recess 222, the first annular electrode can always be in good contact with the second annular electrode even if there is a certain position deviation of the LED lamp bead 121 (the size of the LED lamp beads 121 and the lamp recesses 222 cannot be tightly fit, a certain gap must be maintained to facilitate the LED lamp bead 121 entering the lamp recess 222).

Specifically, the gap X1 between the second annular electrode and the wall of the lamp recess 222 is smaller than the gap X2 between the first annular electrode and the first solid block electrode. With this design, even if the LED lamp bead 121 is displaced in the lamp recess 222, the displacement will not be greater than X1, otherwise, the second annular electrode will contact the wall of the lamp recess 222, restricting a further displacement of the LED lamp bead 121. The gap X2 is always greater than the gap X1, such that, even if the LED lamp bead 121 is displaced, the first anode 1212 of the LED lamp bead 121 will not contact the second cathode 2223 in the lamp recess 222 of the driver circuit substrate 20 to cause a short circuit.

In one embodiment, the driver circuit substrate 20 is designed to have a square shape, and the mounting position of the LED lamp bead 121 is etched out on the driver circuit substrate 20 through an etching process, and the size of the LED lamp bead is determined according to the resolution of the product. The lamp recess 222 is designed such that other positions except for the lamp recess 222 are designed to be flat.

Figure 11:
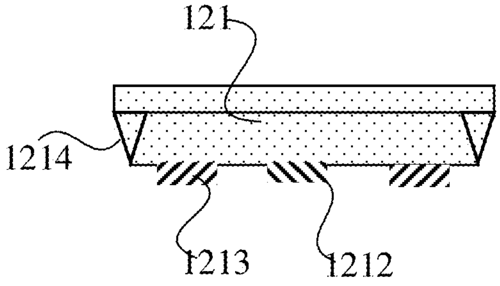
FIG. 11 is a schematic structural diagram of the LED lamp bead according to another embodiment.

In one embodiment, referring to FIG. 11, the LED lamp bead 121 is designed with a first chamfer 1214 to facilitate the LED lamp bead 121 entering the lamp recess 222.

Figure 12:
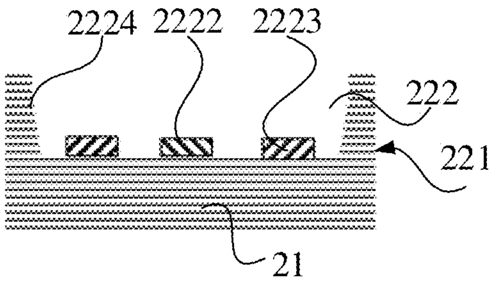
FIG. 12 is a schematic structural diagram of the lamp mount according to another embodiment.

In one embodiment, referring to FIG. 12, a second chamfer 2224 is provided in the opening of the lamp recess 222, so that the second chamfer 2224 acts as a guide when the LED lamp bead 121 is placed in the lamp recess 222, thereby preventing the LED lamp bead 121 from being damaged due to collision with the edges and corners of the lamp recess 222.

In one embodiment, the lamp recess 222 is wider at the top and narrower at the bottom, so that the LED lamp bead 121 can be smoothly inserted into the lamp recess 222 during the transfer.

In some embodiments, after step S100, the method further includes: washing the growth substrate 10 with a cleaning solution, so that a water film is formed on the surface of the LED lamp bead array 12.

In some embodiments, after step S200, the method further includes: washing the driver circuit substrate 20 with a cleaning solution, so that a water film is formed on the surface of the lamp mount array 22.

In this way, since the growth substrate 10 and the driver circuit substrate 20 will inevitably contact with each other during the aligning process, and there will inevitably be friction therebetween when adjusting their positions, in order to avoid damage to the LED lamp bead 121 and the first electrode 1211 thereof, a cleaning solution is used. On the one hand, it can be ensured that there is no foreign matter in the joint portion of the growth substrate 10 and the driver circuit substrate 20, so that impurities that affect the quality can be avoided, and on the other hand, after cleaning, a layer of water film can be formed on the surfaces of the growth substrate 10 and the driver circuit substrate 20 facing each other, the water film can reduce friction and protect the LED lamp bead 121 from being damaged during alignment. After the alignment is completed, the driver circuit substrate 20 can be properly heated to evaporate the water film.

In some embodiments, referring to FIG. 6, step S400 is specifically as follows:

S410: abutting bosses 51 of the roller 50 against a back surface of the growth substrate 10.

S420: heating the bosses 51 to evaporate the release layer 14.

It can be understood that, in other embodiments, the material of the release layer is a material that has a reduced or failed connecting ability upon irradiation by laser beams. For example, the first substrate 11 is a transparent substrate, and when the side of the first substrate 11 away from the LED lamp bead array 12 is irradiated by laser beams, the laser beams can pass through the first substrate 11 and reach the other side of the first substrate 11, so that the release layer is evaporated, and the LED lamp beads 121 are able to detach from the first substrate 11.

Specifically, the release layer is made of GaN, which can be partially decomposed to generate nitrogen gas when irradiated by laser beams, and the nitrogen gas generates thrust to push the LED lamp beads 121 away from the first substrate 11 and fall off from the first substrate 11.

In some other embodiments, the release layer is a photoresist, which can also achieve the separation.

The above descriptions are only preferred embodiments of the present application, and are not intended to limit the present application. Any modifications, equivalent substitutions and improvements made within the spirit and principles of the present application should fall within the scope of protection of the present application.

What is claimed is:

1. A mass transfer method for LED lamp beads, comprising:

S100: providing a growth substrate, the growth substrate comprising a first substrate and an LED lamp bead array disposed on one surface of the first substrate, LED lamp beads of the LED lamp bead array being connected to the first substrate through a release layer;

S200: providing a driver circuit substrate, the driver circuit substrate comprising a second substrate and a lamp mount array disposed on one surface of the second substrate, the lamp mount array being matched with the LED lamp bead array;

S300: moving the growth substrate to a position above the driver circuit substrate, and rotating the growth substrate and/or the driver circuit substrate so that the LED lamp bead array is aligned with the lamp mount array; and

S400: evaporating the release layer and removing the first substrate.

2. The mass transfer method for LED lamp beads as claimed in claim 1, wherein a first workbench comprises a first operating platform and a first support column rotatably connected to the first operating platform, and the growth substrate is detachably fixed on one side of the first operating platform away from the first support column;

and wherein, S300 comprises

S310: grasping the first workbench with a robot arm, and moving the first workbench to the position above the driver circuit substrate;

S320: rotating the first operating platform, so that the LED lamp bead array is aligned with the lamp mount array; and

S330: separating the growth substrate from the first operating platform.

3. The mass transfer method for LED lamp beads as claimed in claim 2, wherein a circular track groove is provided on one of the first operating platform and the first support column, a sliding wheel is provided on the other one of the first operating platform and the first support column, and the sliding wheel is slidably disposed in the circular track groove.

4. The mass transfer method for LED lamp beads as claimed in claim 2, wherein the first workbench further comprises a first air pipe and a first airbag, the first air pipe is fixedly installed on the first operating platform with an end of the first air pipe extending to protrude from the growth substrate, the first airbag is mounted at the end of the first air pipe and communicates with the first air pipe, the first airbag is pressed against the first substrate when inflated, so as to press and fix the growth substrate on the first operating platform.

5. The mass transfer method for LED lamp beads as claimed in claim 2, wherein S320 comprises:

S321: placing the driver circuit substrate on a second operating platform of a second workbench, wherein a first optical alignment mark is provided on the first operating platform, and a second optical alignment mark is provided on the second operating platform; and

S322: rotating the first operating platform to align the first optical alignment mark with the second optical alignment mark.

6. The mass transfer method for LED lamp beads as claimed in claim 1, wherein each LED lamp bead has a first electrode facing away from the first substrate, a lamp mount in the lamp mount array is a lamp recess, and a second electrode is provided on a bottom of the lamp recess.

7. The mass transfer method for LED lamp beads as claimed in claim 6, wherein the first electrode comprises a first anode and a first cathode, and the second electrode comprises a second anode and a second cathode;

wherein, the first cathode is a first annular electrode, the first anode is a first solid block electrode, the first annular electrode is disposed around the first solid block electrode with a gap between the first annular electrode and the first solid block electrode; and the second cathode is a second annular electrode, the second anode is a second solid block electrode, and the second annular electrode is disposed around the second solid block electrode with a gap between the second annular electrode and the second solid block electrode.

8. The mass transfer method for LED lamp beads as claimed in claim 7, wherein a gap between the second annular electrode and a wall of the lamp recess is smaller than the gap between the first annular electrode and the first solid block electrode.

9. The mass transfer method for LED lamp beads as claimed in claim 1, wherein after S100, the method further comprises: washing the growth substrate with a cleaning solution, so that a water film is formed on a surface of the LED lamp bead array; and/or after S200, the method further comprises: washing the driver circuit substrate with a cleaning solution, so that a water film is formed on a surface of the lamp mount array.

10. The mass transfer method for LED lamp beads as claimed in claim 1, wherein S400 comprises:

abutting a boss of a roller against a back side of the growth substrate; and heating the boss to evaporate the release layer.

11. The mass transfer method for LED lamp beads as claimed in claim 2, wherein S400 comprises:

abutting a boss of a roller against a back side of the growth substrate; and heating the boss to evaporate the release layer.

12. The mass transfer method for LED lamp beads as claimed in claim 3, wherein S400 comprises:

abutting a boss of a roller against a back side of the growth substrate; and heating the boss to evaporate the release layer.

13. The mass transfer method for LED lamp beads as claimed in claim 4, wherein S400 comprises:

abutting a boss of a roller against a back side of the growth substrate; and heating the boss to evaporate the release layer.

14. The mass transfer method for LED lamp beads as claimed in claim 5, wherein S400 comprises:

abutting a boss of a roller against a back side of the growth substrate; and heating the boss to evaporate the release layer.

15. The mass transfer method for LED lamp beads as claimed in claim 6, wherein S400 comprises:

abutting a boss of a roller against a back side of the growth substrate; and heating the boss to evaporate the release layer.

16. The mass transfer method for LED lamp beads as claimed in claim 7, wherein S400 comprises:

abutting a boss of a roller against a back side of the growth substrate; and heating the boss to evaporate the release layer.

17. The mass transfer method for LED lamp beads as claimed in claim 8, wherein S400 comprises:

abutting a boss of a roller against a back side of the growth substrate; and heating the boss to evaporate the release layer.

18. The mass transfer method for LED lamp beads as claimed in claim 9, wherein S400 comprises:

abutting a boss of a roller against a back side of the growth substrate; and heating the boss to evaporate the release layer.

* * * * *